United States Patent
Appleton

(10) Patent No.: US 10,411,717 B2
(45) Date of Patent: Sep. 10, 2019

(54) DEVICE AND METHOD FOR MULTIPLE REFERENCE SYSTEM TIMER

(71) Applicant: Samsung Electronics Co., Ltd., Gyeonggi-do (KR)

(72) Inventor: Ian K. Appleton, Garden City (GB)

(73) Assignee: Samsung Electronics Co., Ltd (KR)

( * ) Notice: Subject to any disclaimer, the term of this patent is extended or adjusted under 35 U.S.C. 154(b) by 156 days.

(21) Appl. No.: 15/091,037

(22) Filed: Apr. 5, 2016

(65) Prior Publication Data

US 2017/0288681 A1 Oct. 5, 2017

(51) Int. Cl.
| | |
|---|---|
| *H03L 1/02* | (2006.01) |
| *H03L 7/08* | (2006.01) |
| *H03H 9/19* | (2006.01) |
| *H03L 7/18* | (2006.01) |
| *H04B 1/40* | (2015.01) |

(52) U.S. Cl.
CPC ............ *H03L 7/0802* (2013.01); *H03H 9/19* (2013.01); *H03L 1/026* (2013.01); *H03L 7/1806* (2013.01); *H04B 1/40* (2013.01)

(58) Field of Classification Search
CPC ..... H03L 7/0802; H03L 1/026; H03L 7/1806; H03H 9/19; H04B 1/40
See application file for complete search history.

(56) References Cited

U.S. PATENT DOCUMENTS

| | | | |
|---|---|---|---|
| 2003/0076747 A1* | 4/2003 | Jung | G04G 3/00 368/155 |
| 2007/0155341 A1* | 7/2007 | Haiut | H03L 1/026 455/75 |
| 2008/0112526 A1* | 5/2008 | Yi | H03D 13/004 375/376 |
| 2008/0211589 A1* | 9/2008 | Sano | H03L 7/081 331/55 |
| 2014/0021997 A1* | 1/2014 | Liu | H04W 52/029 327/292 |
| 2014/0139293 A1* | 5/2014 | Tsangaropoulos | H03L 1/022 331/48 |
| 2015/0089261 A1* | 3/2015 | Segawa | G06F 1/3296 713/322 |
| 2017/0177020 A1* | 6/2017 | Mukherji | G06F 1/04 |

* cited by examiner

*Primary Examiner* — Fahmida Rahman
(74) *Attorney, Agent, or Firm* — The Farrell Law Firm, P.C.

(57) ABSTRACT

A device and method is presented to allow the high frequency clock generators and functional blocks of a wireless communication device to enter a very low power sleep state while the low frequency reference clock generator within the wireless communications device remains in an active state. The timing block provides methods of increasing and maintaining accuracy of the system timer which may have been reduced by temperature variation or manufacturing defects. The timing block also allows for selection of the highest accuracy clock from among multiple high frequency clock references. A device for timing control is presented comprising at least one high frequency reference clock, a low frequency reference clock and a timing controller for generating a system timer, wherein the timing controller selects one of the at least one high frequency reference clock and processes the low frequency reference clock with the selected high frequency reference clock.

20 Claims, 4 Drawing Sheets

Figure 2: Frequency-temperature curves for the BT-cut crystal at different angle $\phi^2$

DEVICE AND METHOD FOR MULTIPLE REFERENCE SYSTEM TIMER

BACKGROUND

1. Field of the Disclosure

The present disclosure generally relates to a system timer with multiple reference sources, and more particularly, to a device and method for reduction of power consumption and increased performance of system timing in a mobile wireless communication device.

2. Description of the Related Art

Mobile wireless communication devices contain multiple wireless communications radios designed for various bandwidths, coverage areas, latencies and applications. The increasing number of wireless radios has created challenges in the coordination of transmissions from these heterogeneous radios in order to reduce interference and data traffic congestion. Synchronization of transmissions between radios can reduce interference by providing exclusive timeslots in which each radio can transmit. The interference problem is particularly a problem when the radios are using the same frequency band. In order for synchronization of transmission timing to occur, an accurate system timing controller is necessary. As the mobile wireless communication devices containing multiple radios are battery powered, it is important that the system timing controller consume low power while maintaining high accuracy.

SUMMARY

The present disclosure has been made to address the above problems and disadvantages and to provide at least the advantages described below.

Accordingly, an aspect of the present disclosure provides a device and method for controlling a system timer within a mobile wireless communications device. The system timer comprises multiple clock sources, each of which having a unique frequency of oscillation, accuracy level, temperature variation, drift and power consumption. The system timer provides a timing signal to multiple functional blocks in the system including computing, memory, and communications blocks. Each of these blocks have the ability to be placed in different power consuming states including active and sleep states. When all of the functional blocks are in the sleep state there is no need for a system timer thereby allowing the system timer block to also enter a low power consumption mode. In the low power consumption mode, the system timer block maintains operation of a low frequency reference clock. When any of the computing, memory, or communications blocks comes out of the sleep state and enters the active state, the system timing block recognizes the need to supply that active block with an accurate high frequency system timer. Bringing the timing block out of sleep state with low latency in order to supply the required high frequency system timer requires the timing block to coordinate the synchronization of the low frequency reference clock with one of the available high frequency reference clocks. The low frequency reference clock also requires adjustments to its timing accuracy, particularly as a function of temperature variation.

In accordance with an aspect of the present disclosure, a device for timing control in a wireless communications terminal is provided. The device includes at least one high frequency reference clock, a low frequency reference clock, a timing controller for generating a system timer, wherein the timing controller selects one of at least one of a high frequency reference clock and processes the low frequency reference clock with the selected high frequency reference clock.

In accordance with another aspect of the present disclosure, a method for timing control in a wireless communications terminal is provided, the method includes generating at least one high frequency reference clock, generating a low frequency reference clock and generating a system timer by processing the high frequency reference clock and the low frequency reference clock.

BRIEF DESCRIPTION OF THE DRAWINGS

The above and other aspects, features and advantages of the present disclosure will become more apparent by describing in detail embodiments thereof with reference to the attached drawings in which.

DETAILED DESCRIPTION

Figure 1:
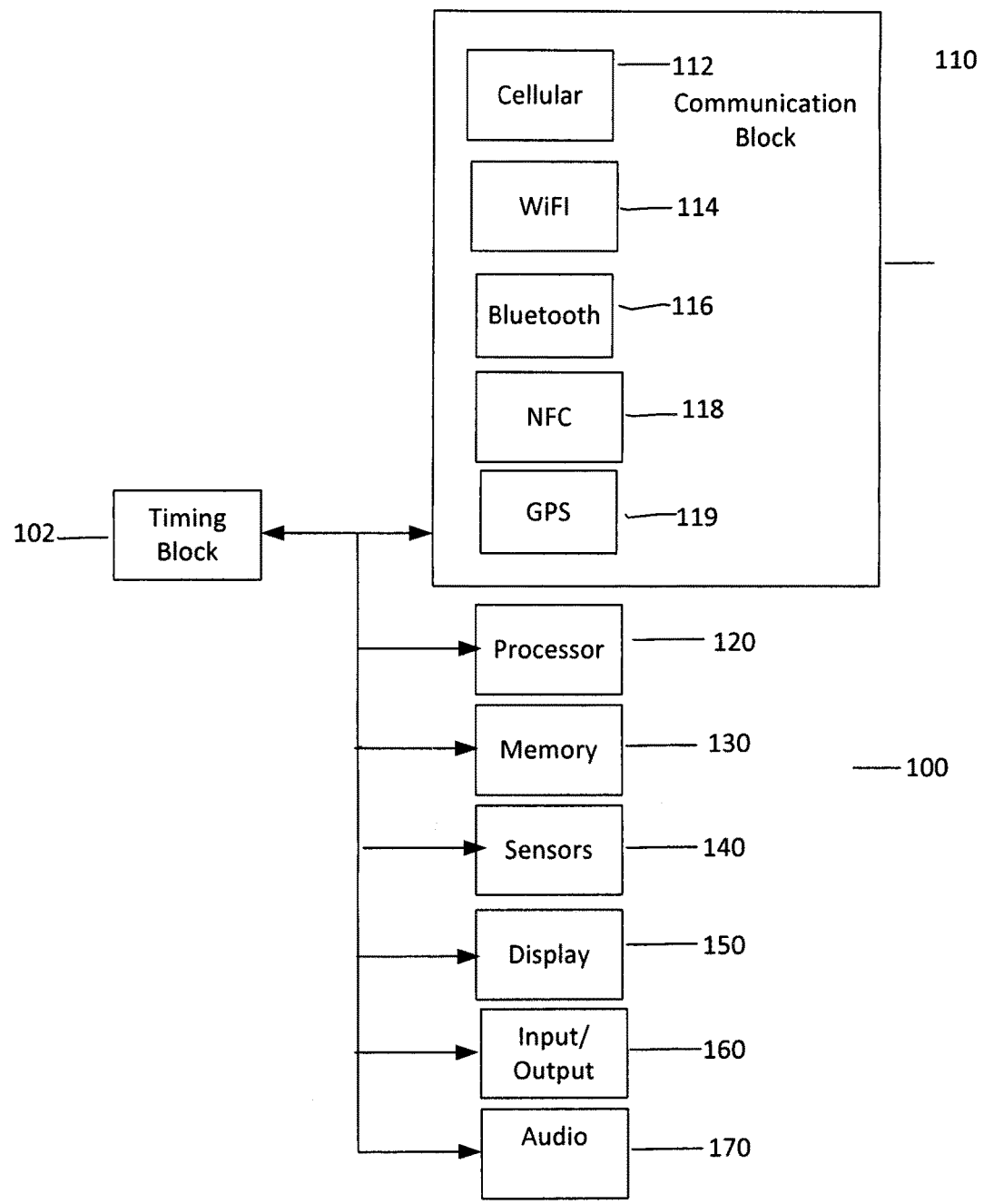
FIG. 1 is a schematic block diagram of a wireless communication device, according to an embodiment of the present disclosure.

The present disclosure now will be described more fully hereinafter with reference to the accompanying drawings, in which embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like reference numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first signal could be referred to as a second signal, and, similarly, a second signal could be referred to as a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having meanings that are consistent with their meaning in the context of the relevant art and/or the present description, and will not be interpreted in an idealized or overly formal sense unless expressly so defined herein.

Each of the components of the wireless communication device according to an embodiment of the present disclosure may be implemented by one or more components and the name of the corresponding component may vary depending on the type of electronic device. In various embodiments of the present disclosure, the electronic device may include at least one of the above-described elements. Some of the above-described elements may be omitted from the electronic device, or the electronic device may further include additional elements. Further, some of the components of the electronic device according to the various embodiments of the present disclosure may be combined to form a single entity, and thus, may equivalently execute functions of the corresponding elements prior to the combination.

The term "block" as used herein may, for example, mean a unit including one of hardware, software, and firmware or a combination of two or more of them. The "block" may be interchangeably used with, for example, the term "unit", 'module', "logic", "logical block", "component", or "circuit". The "block" may be the smallest unit of an integrated component or a part thereof. The "block" may be the smallest unit that performs one or more functions or a part thereof. The "block" may be mechanically or electronically implemented. For example, the "block" according to the present disclosure may include at least one of an Application-Specific Integrated Circuit (ASIC) chip, a Field-Programmable Gate Arrays (FPGA), and a programmable-logic device for performing operations which is known or are to be developed hereinafter.

According to various embodiments of the present disclosure, at least some of the devices (for example, blocks or functions thereof) or the method (for example, operations or steps) according to the present disclosure may be implemented by a command stored in a computer-readable storage medium in a programming module form. When the command is executed by one or more processors (for example, the processor 120), the one or more processors may execute a function corresponding to the command. According to an embodiment of the present disclosure the wireless communication device 100 may have multiple processors within the device and within each functional block, for example the timing block 102. The computer-readable storage medium may be, for example, the memory 130.

FIG. 1 is a schematic block diagram of a wireless communication device 100 according to an embodiment of the present disclosure. The wireless communication device 100 may contain a timing block 102 for providing a system timer to the other functional blocks within the wireless communication device 100 which may include a communication module, a processor 120, a memory 130, a plurality of sensors 140, a display 150, an input/output block 160 and an audio block 170.

The wireless communication device 100 may also include a communication block 110 for connecting the device 100 to a network for communication of voice and data. The communication block 110 may contain wide area, local area, personal area, near field, short range and satellite communications. In particular, the cellular communications block 112 provides a wide area network connection through terrestrial base transceiver stations using technologies such as Long Term Evolution. The WiFi communications block 114 provides a local area network connection through network access points using technologies such as IEEE802.11. The Bluetooth communications block 116 provides personal area direct and networked communications using technologies such as IEEE802.15. The Near Field Communications (NFC) block 118 provides point to point short range communications using standards such as ISO/IEC 14443. The GPS block 119 provides for receiving global navigation satellite signals in order to compute the device's absolute position and also provides an accurate timing reference signal for use as an external timing signal when calibrating the clocks within the timing block 102.

The processor 120 provides and application layer processing functions required by the user of the wireless communication device 100. The processor 120 also provides command and control functionality for the various blocks in the device 100. The processor 120 may provide for updating temperature compensation, calibration or other control data required by the timing block 102.

The memory block 130 provides storage for device control program code, user data storage, application code and data storage. The memory block 130 may provide data storage for the timing block 102 in the form of look up tables, calibration data or control code to be loaded into the timing block 102. The program code and calibration data required by the timing block 102 may be loaded into local storage within the timing block 102 from the memory block 130 upon device boot up. The timing block 102 may also have local non-volatile memory for storing the program code and look up table calibration data for temperature compensation of the low frequency reference clock. The sensor block 140 may contain physical sensing devices for sensing physical conditions internal and external to the wireless communications device 100. The sensor block 140 may also contain electronic conditioning circuits and software control for manipulating sensor data and making it available to the other blocks in the device 100.

The sensor block 140 may provide temperature measurement data for frequency compensation to the timing block in order to increase the accuracy of the clocks generated within the timing block 102.

The display 150 may be a touch panel, and may be embodied as an LCD, LED, OLED, AMOLED, and the like.

The input/output block 160 controls the interface to the user of the device 100. The audio block 170 provides for audio input and output to/from the device 100.

According to an embodiment of the present disclosure, the timing block 102 may contain control blocks for implementing the functionality of the timing block 102. The control blocks may include hard coded finite state machines, discrete logic blocks, programmable hardware accelerator blocks and program code executed on a microcontroller or microprocessor. The timing block 102 may continue to execute timing functions including synchronization and compensation while any or all of the other functional blocks in the wireless communication device 100 are in low power sleep states. When any of the blocks exit the sleep state and require a system timer, the timing block 102 provides the system timer function. In order to further conserve power, the timing block 102 may also enter a low power sleep state when no other blocks require a system timer function. A low frequency reference clock continues to operate while the timing block 102 is in the sleep state. The low frequency reference clock may operate at a nominal 32,768 Hz, but the present disclosure is not restricted thereto.

Figure 2:
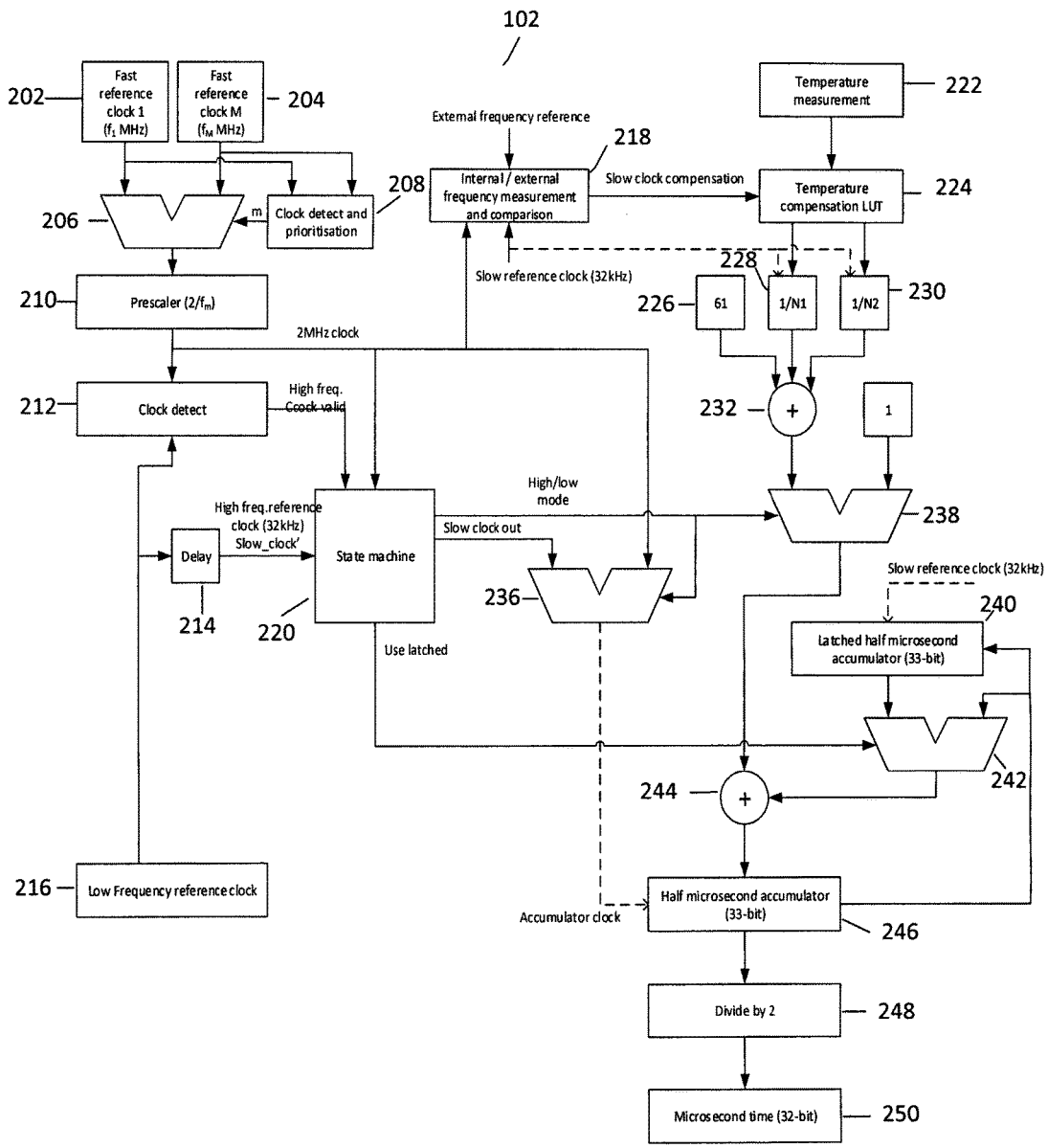
FIG. 2 is a block diagram of the timing block illustrated in FIG. 1, according to an embodiment of the present disclosure.

FIG. 2 is a block diagram of the timing block 102 in a wireless communication device 100, according to an embodiment of the present disclosure. The timing block 102 may have multiple high frequency reference clocks 202, 204. The high frequency reference clocks may be derived from external sources such as crystal oscillators or from internal sources such as a Voltage Controlled Oscillator (VCO) or Phase Locked Loop (PLL). The high frequency reference clocks may oscillate in the MHz range. The high frequency reference clocks 202, 204 may also be derived from other blocks within the wireless communications device 100. The cellular communications block 112 within the communications block 110 may provide at least one of the high frequency reference clocks 202, 204. The present disclosure is not limited to 2 high frequency reference clocks as shown in FIG. 2. The GPS block 119 within the communications block 110 may also provide a high frequency reference clock 202, 204.

When multiple high frequency reference clocks 202, 204 are available to the timing block, one of the high frequency reference clocks 202, 204 is selected for use in generating the clock provided to the functional blocks. The high frequency reference clock that is both available and has the highest accuracy is selected. The determination of the level of accuracy can be hard coded into the device 100 at time of manufacture or programmed into the device 100 at time of manufacture and updated at a later time. In addition, the selection of which high frequency reference clock to be used can be made by one of the other functional blocks.

The clock detection and selection is made by timing block logic 208. The timing block logic 208 controls a multiplexer 206. The multiplexer 206 allows one of the high frequency reference clocks to enter the prescaler block 210 as determined by the timing block logic 208. The high frequency reference clock 202, 204 which is selected by the timing block logic 208 passes through the multiplexer 206 and then enters a prescaler where it is scaled down to a frequency of 2 MHz and enters the finite state machine 220. The presence of the scaled high frequency reference clock is detected by clock detect block 212, by counting the number of prescaled high frequency clock cycles per low frequency reference clock cycle. The high frequency clock is valid if the ratio of high frequency cycles to low frequency cycles is between 61 and 62 (assuming a 32768 Hz low frequency reference clock and a prescaled frequency of 2 MHz). The low frequency reference clock is always valid and available. The clock_valid signal is an input to the finite state machine 220. The timing block 102 provides a 1 MHz clock to the functional blocks within the device 100 but the present invention is not restricted thereto. The low frequency reference clock 216 may be derived from a common quartz crystal which typically exhibits high frequency variation over temperature. The low frequency reference clock 216 is always active and does not enter a sleep state. In order to automatically compensate for the variation of the low frequency reference clock as a function of temperature, a Look Up Table (LUT) 224 contains a database of compensation factors as a function of temperature and may be used to correct the frequency error.

Figure 3:
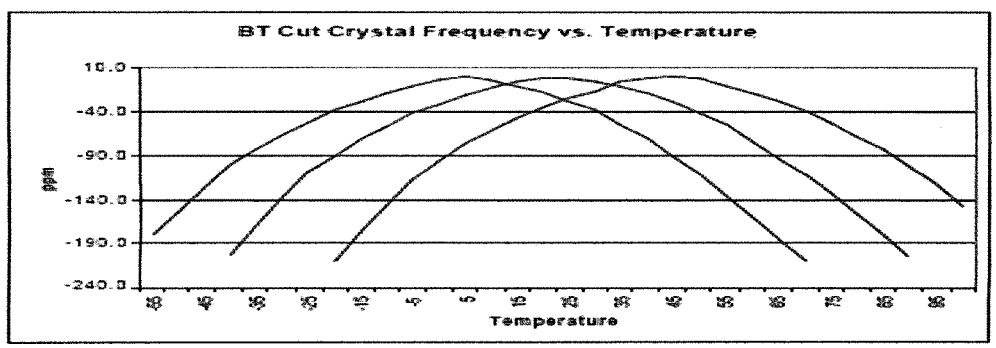
FIG. 3 is a temperature compensation curve for the low frequency reference clock, according to an embodiment of the present disclosure.

FIG. 3 is a compensation curve indicating the variation in frequency as a function of temperature of a typical low frequency quartz crystal reference clock. The Look Up Table 224 which may be used to temperature compensate the low frequency reference clock contains values from the temperature compensation curve of FIG. 3. The quartz crystal frequency will change with temperature and the amount of the change depends on the type of crystal used. The temperature compensation curve of FIG. 3 models the variation in frequency of oscillation of the crystal as a function of ambient temperature.

The temperature measurement 222 of the low frequency reference clock 216 may come from the sensor block 140 or from temperature measurements internal to the low frequency reference clock 216. The temperature compensation for the low frequency reference clock 216 may also come from a processor 120 executing code. The code for temperature compensation will compute the compensation factor as a function of multiple variables including the measured temperature of the low frequency reference clock 216 and the temperature sensitivity factor of the crystal or other device generating the low frequency reference clock 216. The high frequency reference clocks 202, 204 may have a good initial accuracy (e.g. ±10 ppm) and good variation with temperature (e.g. ±10 ppm), but are not always available to the functional blocks as they may be turned off in deep-sleep power saving mode. The low frequency reference clock 216 may have a poor initial accuracy as compared to the high frequency reference clocks 202, 204 (e.g. ±50 ppm) and higher temperature variation as compared to the high frequency reference clocks 202, 204 (e.g. ±200 ppm), but the low frequency reference clock 216 is always present and available to the system.

The present disclosure combines the best properties of each of the low frequency reference clock 216 and high frequency reference clocks 202, 204 to give a system time clock which is accurate when the system is not in sleep mode, and continues operation with reduced accuracy when the system is in sleep mode. The reduction in accuracy of the low frequency reference clock 216 is mitigated by providing temperature compensation LUT 224 and allowing a processor 120 to calibrate and compensate the low frequency reference clock 216 with respect to the high frequency reference clocks 202, 204 or other external frequency references including the GPS receive block 119, the cellular communications block 112 or other external source.

The frequency of the low frequency reference clock 216 may not be exactly 32,768 Hz due to inherent variations in the crystal material, its manufacturing process and variations over time and temperature. A processor 120 in the system may periodically calibrate the low frequency reference clock 216 against the high frequency clock using the frequency measurement and comparison block 218 and if available, refine the calibration with measurements against external references available in communications block 110 including the cellular communications block 112, the GPS block 119 or other external references, and update the values of N1 228 and N2 230 such that:

61+1/N1+1/N2=high frequency reference clock/low frequency reference clock

Changing N1 and N2 relative to their nominal values (32 and 256 respectively) gives the following adjustment resolution and range:

N1:16 ppm steps (close to nominal), minimum offset=−512 ppm (N1=0, N2=256), maximum offset depends on max N values.

N2:0.25 ppm steps (close to nominal), minimum offset=
−64 ppm (N1=32, N2=0), maximum offset depends on max
N values.

The values of 61, 1/N1, 1/N2 are summed in adder 232.

The temperature compensation LUT 224 is combined
with the processor 120 compensation of the low frequency
reference clock by having the processor 120 update the LUT
224 from its default or current values, adding a constant
value to all entries based on the measured frequency error of
the low frequency reference clock.

The finite state machine 200 is responsible for generating
as an output a high/low_mode signal used to control the high
frequency/low frequency multiplexers 236, 238 and a use_
latched signal which controls the accumulator multiplexer
242 to either use the latched half-microsecond accumulator
240 or the live half-microsecond accumulator 246. The finite
state machine 220 also provides as an output a delayed
version of the low frequency reference clock (lowfreq_
clock) signal which is labelled (lowfreq_clock_out) in FIG.
2. The time delay of the low frequency reference clock 216
is generated by delay block 214 of FIG. 2. The time delay
function may be generated by cascading logic gate delays
within the delay block 214 to generate the desired length of
delay time. The delayed low frequency reference clock is
therefore guaranteed to clock after the high/low_mode and
use_latched signals have been set up. The delayed low
frequency reference clock is used to trigger the live half
microsecond accumulator 246 every low frequency refer-
ence clock cycle.

Figure 4:
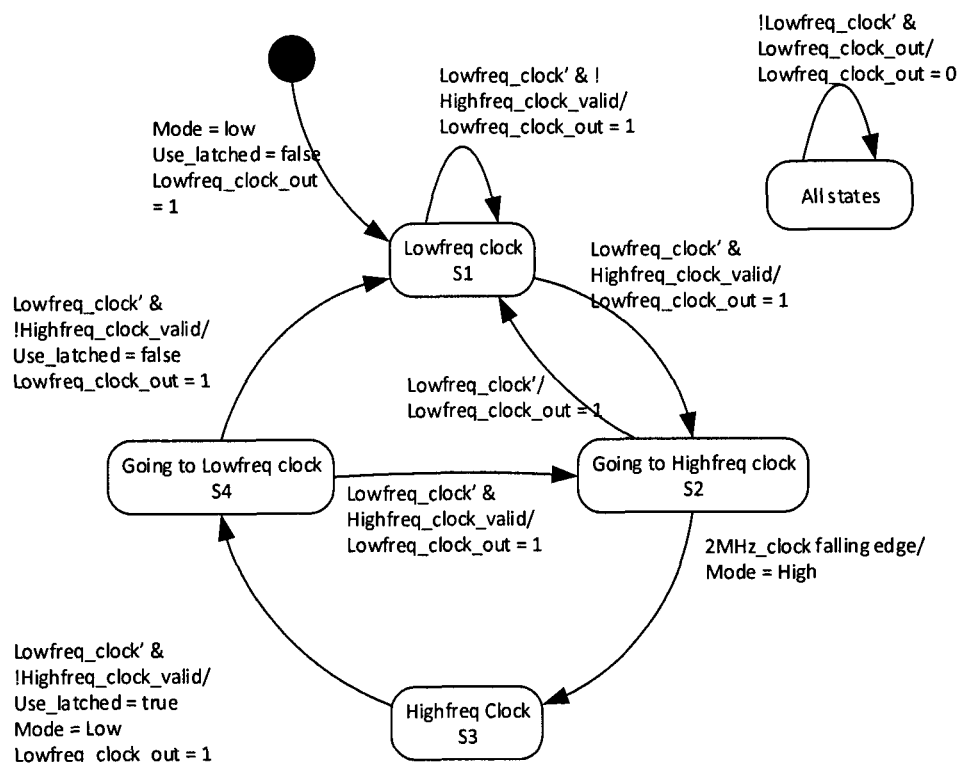
FIG. 4 is a finite state machine diagram of the timing block illustrated in FIG. 2 according to an embodiment of the present disclosure.

Referring to the finite state machine of FIG. 4, on system
startup or reboot the finite state machine 220 begins in the
lowfreq clock state S1. The live half-microsecond accumu-
lator 246 is clocked from the low frequency reference clock.
The live half-microsecond accumulator 246 is incremented
by approximately 2 MHz/32768 Hz on each low frequency
reference clock edge.

When the high frequency clock has been valid for at least
one low frequency reference clock cycle, the highfreq_
clock_valid signal will be asserted at the end of the low
frequency reference clock cycle. The highfreq_clock_valid
signal will go active or inactive just after the low frequency
reference clock edge, so the finite state machine 220 uses a
time delayed version of the low frequency reference clock
indicated as lowfreq_clock' which is guaranteed to transition
after the highfreq_clock_ valid signal.

If the highfreq_ clock_ valid signal is true at the rising
edge of lowfreq_clock', the state machine 220 transitions to
the "going to highfreq clock" state S2. The state machine
220 transitions to highfreq clock state S2 on the next falling
edge of the 2 MHz clock. This ensures that there is sufficient
set-up time for the high/low mode signal into the multiplex-
ers before the 2 MHz clock rising edge which clocks the live
half microsecond accumulator 246. If the highfreq clock
fails in the "going to highfreq clock" state S2, the system
will return to the lowfreq clock state S1 on the next rising
edge of lowfreq_clock'.

When in the highfreq clock state S3, the live half-
microsecond accumulator 246 is clocked from the 2 MHz
clock output from the prescaler 210. When the highfreq_
clock_valid fails, the highfreq_clock_valid signal will be
deasserted after the, next low frequency reference clock
rising edge. The finite state machine 220 transitions to the
"going to lowfreq clock" S4 state on the corresponding
rising edge of lowfreq_clock', setting the use_latched signal
and setting the high/low mode to low causing the live half
microsecond accumulator 246 to increment by approxi-
mately 2 MHz/32768 Hz from the value latched on the
previous low frequency reference clock edge, discarding the
unknown number of increments from the high frequency
clock before it failed. On the next rising edge of
lowfreq_clock', the finite state machine 220 transitions to the
lowfreq clock state S1, deasserting use_latched so that the
accumulator 246 increments by approximately 2 MHz/
32768 Hz from its current value each low frequency refer-
ence clock cycle.

The amount the live half microsecond accumulator 246
needs to increment by each low frequency reference clock
cycle needs to average 2 MHz/32768 Hz when the low
frequency reference clock is exactly 32768 Hz. This is equal
to 61+1/32+1/256. Therefore the accumulator 246 can be
incremented by 61 every cycle+1 every 32 cycles+1 every
256cycles using the circuit shown in blocks 226, 228, 230
and 232 (where N1=32 and N2=256).

The value of the live half microsecond accumulator 246
is divided by 2 in the divide register 248. The accumulator
value divided by 2 in the divide register 248 is available in
the microsecond time register 250 for system timing control
of the functional blocks 110, 120, 130, 140, 150, 160 and
170 of the wireless communications terminal 100.

While the present disclosure has been particularly shown
and described with reference to certain embodiments
thereof, it will be understood by those of ordinary skill in the
art that various changes in forms and details may be made
therein without departing from the spirit and scope of the
present invention as defined by the following claims and
their equivalents.

What is claimed is:

1. A device for timing control, the device comprising:
   a plurality of high frequency reference clocks;
   a low frequency reference clock;
   a timing controller for generating a system timer and
      selecting one of the plurality of high frequency refer-
      ence clocks;
   a temperature measurement unit for measuring a tempera-
      ture of the low frequency reference clock;
   a temperature compensation look up table; and
   a processor for correcting a frequency error in the low
      frequency reference clock using temperature measure-
      ment data from the temperature measurement unit and
      frequency error data from the temperature compensa-
      tion look up table,
   wherein the timing controller processes the low frequency
      reference clock with the selected high frequency ref-
      erence clock, and
   wherein the processor corrects the frequency error in the
      low frequency reference clock using the temperature
      measurement data from the temperature measurement
      unit by adjusting values of N1 and N2, based on the
      temperature measurement data, such that:
   A+1/N1+1/N2=high frequency reference clock/ low fre-
      quency reference clock, where A is an integer.

2. The device of claim 1, wherein the timing controller
calculates the frequency error of the low frequency reference
clock and generates a compensation factor to reduce the
frequency error.

3. The device of claim 2, wherein the frequency error is
due to temperature variation.

4. The device of claim 2, wherein the compensation factor
is generated from a plurality of compensation factors stored
in a memory of the device.

5. The device of claim 1, wherein the low frequency
reference clock oscillates at a frequency of 32,768 Hz.

6. The device of claim 1, wherein the plurality of high
frequency clocks oscillate at frequencies of at least 1 MHz.

7. The device of claim 1, wherein the system timer is generated for timing synchronization of communication blocks within a wireless communications terminal.

8. The device of claim 1, wherein the plurality of high frequency reference clocks enter low power sleep states when the system timer is not required by a wireless communications terminal.

9. The device of claim 1, wherein the plurality of high frequency reference clocks comprise a global navigation satellite system receiver, a cellular communications transceiver, and a quartz crystal oscillator.

10. The device of claim 1, wherein the integer A is 61.

11. A method for timing control, the method comprising the steps of:
 generating a plurality of high frequency reference clocks;
 generating a low frequency reference clock; and
 generating a system timer by selecting one of the plurality of high frequency reference clocks and processing the low frequency reference clock with the selected high frequency reference clock,
 wherein the system timer is used for timing synchronization in a wireless communication terminal,
 wherein generating the low frequency reference clock comprises correcting a frequency error in the low frequency reference clock using a measured temperature of the low frequency reference clock, and
 wherein correcting the frequency error in the low frequency reference clock using the measured temperature of the low frequency reference clock comprises adjusting values of N1 and N2, based on the measured temperature of the low frequency reference clock, such that:
 A+1/N1+1/N2=high frequency reference clock/ low frequency reference clock, where A is an integer.

12. The method of claim 11, wherein the selected high frequency reference clock is selected from the plurality of high frequency reference clocks based on an accuracy of the selected high frequency reference clock.

13. The method of claim 11, wherein the integer A is 61.

14. The method of claim 11, wherein the frequency error is corrected, based on the measured temperature of the low frequency reference clock, using a plurality of compensation factors stored in a memory of the wireless communications terminal.

15. The method of claim 11, wherein the low frequency reference clock oscillates at a frequency of 32,768 Hz.

16. The method of claim 11, wherein the plurality of high frequency reference clocks oscillate at a frequency of at least 1 MHz.

17. The method of claim 11, wherein the system timer is generated for timing synchronization of communication blocks within the wireless communications terminal.

18. The method of claim 11, wherein the plurality of high frequency reference clocks enter low power sleep states when the system timer is not required by the wireless communications terminal.

19. The method of claim 11, wherein the plurality of high frequency reference clocks comprise a GPS receiver, a cellular communications transceiver, and a quartz crystal oscillator.

20. An apparatus for timing control in a wireless communications terminal, comprising:
 a plurality of high frequency reference clocks;
 a scaled high frequency reference clock;
 a low frequency reference clock;
 a time delayed low frequency reference clock;
 timing block logic for selecting one of the plurality of high frequency reference clocks;
 a prescaler circuit for dividing the selected one of the plurality of high frequency reference clocks to generate the scaled high frequency reference clock;
 a temperature measurement unit for measuring the temperature of the low frequency reference clock;
 a temperature compensation look up table;
 a processor for correcting frequency error in the low frequency reference clock using temperature measurement data from the temperature measurement unit and frequency error data from the temperature compensation look up table;
 a finite state machine for controlling selection of the scaled high frequency clock or the time delayed low frequency reference clock; and
 a circuit for providing a system timer to functional blocks of the wireless communications terminal including an accumulator,
 wherein the accumulator is clocked by the time delayed low frequency reference clock or the scaled high frequency reference clock as determined by the finite state machine, and
 wherein the processor corrects the frequency error in the low frequency reference clock using the temperature measurement data from the temperature measurement unit by adjusting values of N1 and N2, based on the temperature measurement data, such that:
 A+1/N1+1/N2=high frequency reference clock/ low frequency reference clock, where A is an integer.

* * * * *